United States Patent [19]

Suzuki et al.

[11] Patent Number: 5,156,318

[45] Date of Patent: Oct. 20, 1992

[54] ULTRASONIC BONDING APPARATUS FOR BONDING A SEMICONDUCTOR DEVICE TO A TAB TAPE

[75] Inventors: Yasushi Suzuki; Akio Bando, both of Tokyo, Japan

[73] Assignee: Kabushiki Kaisha Shinkawa, Tokyo, Japan

[21] Appl. No.: 777,075

[22] Filed: Oct. 16, 1991

[30] Foreign Application Priority Data

Oct. 16, 1990 [JP] Japan .................... 2-276663

[51] Int. Cl.⁵ .......................................... B23K 20/10
[52] U.S. Cl. .................................. 228/4.5; 228/904
[58] Field of Search ............ 228/110, 4.5, 904, 180.2, 228/1.1; 74/89

[56] References Cited

U.S. PATENT DOCUMENTS

| 3,997,100 | 12/1976 | Hofmeister | 228/179 |
| 4,239,144 | 12/1980 | Ellis et al. | 228/904 |
| 4,550,871 | 11/1985 | Chan et al. | 228/4.5 |
| 4,792,079 | 12/1988 | Bansemir | 228/4.5 |
| 4,817,848 | 4/1989 | Gabaldon | 228/4.5 |

FOREIGN PATENT DOCUMENTS 63-86533 4/1989 Japan ..................... 228/4.5

Primary Examiner—Richard K. Seidel
Assistant Examiner—Jeanne M. Elpel
Attorney, Agent, or Firm—Koda & Androlia

[57] ABSTRACT

In a method for bonding inner leads arranged along a square opening of a tab tape to a semiconductor device, the inner leads of a pair of inner lead rows that face each other are bonded first to the semiconductor device and then a bonding tool is rotated 90 degrees so that inner leads of another pair of inner lead rows are bonded. An ultrasonic bonding apparatus that uses such a method includes a rotary shaft that has the bonding tool at the bottom and is rotated 90 degrees (or any desired angle) via rollers that are mounted eccentrically on the rotary shaft. When the rollers are moved back and forth via a cylinder assembly, the rotary shaft that is eccentric with the rollers is rotated and rotated back 90 degrees, thus making it possible to perform the bonding of inner leads arranged along the square opening of a tab tape by restraining the horn only twice.

3 Claims, 5 Drawing Sheets

ULTRASONIC BONDING APPARATUS FOR BONDING A SEMICONDUCTOR DEVICE TO A TAB TAPE

BACKGROUND OF THE INVENTION

1. Field of the Invention

The present invention relates to a method for individually bonding inner leads installed on a tab tape to electrodes of semiconductor devices by a bonding tool and also to an ultrasonic bonding apparatus that uses the method.

2. Prior Art

As shown in FIG. 6(a), inner lead of inner lead rows 2a, 2b, 2c and 2d of a tab tape 1 are installed so that they stick into a squire opening of the tab tape 1. The leads project at right angles form each of the four sides of the opening in the X and Y directions. The leads of inner lead rows 2a through 2d of the tab tape 1 are as shown in FIG. 6(b) individually bonded to electrodes 3a of a semiconductor device 3 when ultrasonic waves are applied to the bonding tool 4 that is at the tip end of horn 5.

The direction of the ultrasonic vibration of the horn 5 is set so that it is in the same direction as the axis of the horn 5. In conventional methods, therefore, the direction of the horn 5 needs to be shifted to match the direction of all the leads of inner lead rows 2a through 2d so that the ultrasonic waves are uniformly applied to the leads of each of the inner lead rows 2a through 2d. This will be described below in more detail.

First, any positional discrepancy between the inner leads of rows 2a through 2d and the electrodes 3a is detected by a detection means (not shown), and then the positions of the inner leads and electrodes are aligned to eliminate the discrepancy. The bonding action by the bonding tool 4 which is at the end of the horn 5 starts with the right-end inner lead 2a-1 of the inner lead row 2a (see FIG. 6(a)). The alignment of the horn 5 is in the Y direction. The bonding tool 4 is lowered to press the inner lead 2a-1 against the corresponding electrode 3a, and an ultrasonic vibration is applied to the horn 5. The inner lead 2a-1 and electrode 3a are thus bonded together. The, the bonding tool 4 is raised and moved in the X direction so that it is above the next inner lead 2a-2. The inner lead 2a-2 and the corresponding electrode 3a are bonded by the same manner as that described above.

When the bonding of all the inner lead of the row 2a has been completed, the horn 5 is rotated to shift 90 degrees so that the axial direction of the horn 5 is brought into the same direction as the inner leads of inner lead row 2b. The inner leads of the row 2b are bonded in the same manner as the inner leads of the row 2a are bonded.

When the bonding of the inner leads of the row 2b is completed, the horn 5 is again shifted 90 degrees so that it can bond the inner leads of row 2c. The inner leads of the row 2c are bonded in the same manner as described above. When the bonding on the inner leads of row 2c is completed, the horn 5 is shifted 90 degrees, and the inner leads of row 2d are bonded. When the bonding of the inner leads of the row 2d is finished, the horn 5 is again shifted 90 degrees, thus returning to the starting position.

As seen from the above, the horn 5 is shifted four times in direction (90 degrees each time and totally 360 degrees) in order to perform the bonding of all the inner leads to a single semiconductor device.

One example of ultrasonic bonding apparatus that rotates the horn 360 degrees as described above is shown in Japanese Patent Application Publication No. 62-27741.

The bonding apparatus disclosed in this Publication includes (a) a horn that holds a bonding tool, (b) a rotary shaft which is installed coaxially with the bonding tool and indirectly holds the horn, (c) a vertically moving block which rotatably supports the rotary shaft, (d) a vertically driving mechanism that moves the vertically moving block up and down, and (e) a rotary driving mechanism that rotates the rotary shaft. The rotary driving mechanism rotates the rotary shaft via a belt system installed between a pulley of an output shaft of the motor for the rotary driving mechanism and a pulley of the rotary shaft.

In this apparatus, the horn must be shifted four times for each semiconductor device. This results in waste of time, keeping the productivity very low.

Furthermore, in the above ultrasonic bonding apparatus, a motor is used to rotate the rotary shaft, and it needs a heavy-weight vertically moving block to mount the motor thereon. As a result, excessive force applies not only the vertically driving mechanism, that moves the vertically moving block up and down, but also onto an X-Y table driving mechanism, which moves the vertically moving block in the X-Y direction. Furthermore, since the motor controls the 90 degree rotation of the rotary shaft, the control system is complicated. In addition, the precision of rotation of the rotary shaft is easily affected by a slippage of the belt that transmits the rotation of the motor to the rotary shaft.

SUMMARY OF THE INVENTION

Accordingly, it is a first object of the present invention to provide a method for bonding semiconductor devices to a tab tape with an improved productivity.

It is a second object of the present invention to provide an ultrasonic bonding apparatus in which a rotary shaft that holds a bonding tool is rotated a predetermined angle without using a motor so as to lessen the weight of a rotary driving mechanism and in which the rotary driving mechanism is controlled easily, increasing precision of the angle of rotation of the rotary shaft.

The first object of the present invention is achieved by a method wherein the leads of two opposite rows of inner leads are first bonded to electrodes of a semiconductor devices and then the horn that has a bonding tool is rotated 90 degrees so that the leads on the remaining two rows of inner leads are bonded.

The second object of the present invention is achieved by constructing the rotary driving mechanism, that rotates the horn a predetermined angle, with rollers installed on a rotary shaft in an eccentric fashion relative to the rotary shaft, a cylinder assembly which linearly moves the rollers, and a pair of stoppers which restrict the range of linear movement of the rollers and therefore determine the angle of rotation of the rotary shaft.

According to the method of the present invention, the leads on two rows that face each other ar respectively bonded and then leads on other two rows that face each other are bonded. Thus, the number of rotations of the horn is less (twice), and the productivity can increase.

According to the ultrasonic bonding apparatus of the present invention, since a cylinder assembly is used, and not a motor, to rotate a shaft that has the bonding tool, the overall weight of the rotary driving mechanism can be reduced because a vertically moving block that mounts the motor thereon and is heavy is not used. In addition, since the cylinder assembly is controlled only by an "ON and OFF" operation thereof, the rotary driving mechanism is operated easily. Furthermore, since the angle of rotation of the rotary shaft is determined by the distance between the two stoppers, a highly precise rotation of the rotary shaft is accomplished.

In the ultrasonic bonding apparatus of the present invention, since the rotary shaft makes a predetermined angular rotation, the apparatus is especially suitable for use in a method for bonding semiconductor devices to a tab tape in which the horn is rotated 90 degrees as described above.

BRIEF DESCRIPTION OF THE DRAWINGS

FIGS. 3, 4 and 5 illustrate one embodiment of the ultrasonic bonding apparatus of the present invention, in which FIG. 3 is a side view, FIG. 4 is a front view, and FIG. 5 is a partially cross-sectional plan view; and FIG. 6 illustrates a conventional method for bonding a semiconductor device to a tab tape wherein

DETAILED DESCRIPTION OF THE INVENTION

Figure 6A:
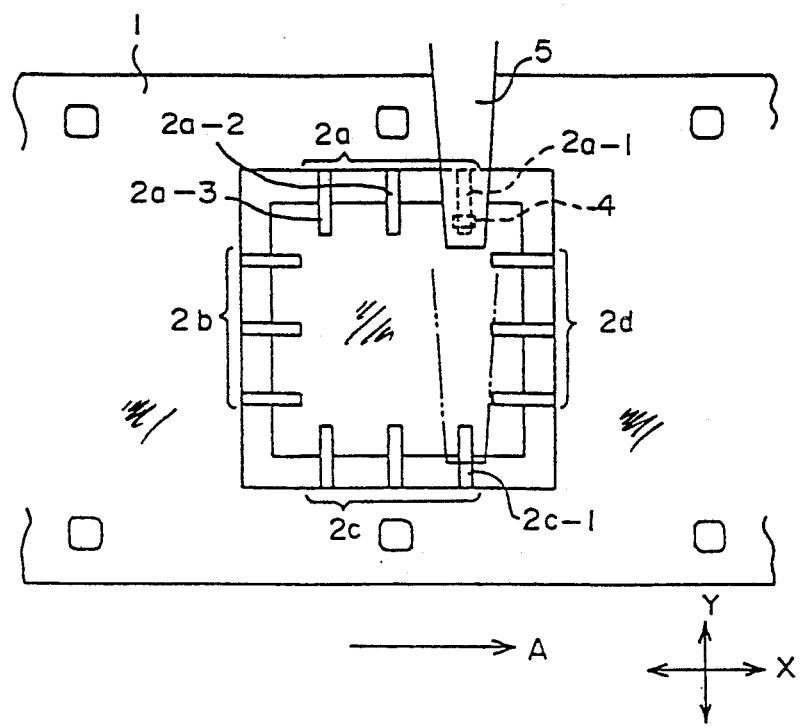
FIG. 6(a) is a top view and FIG. 6(b) is front view.
Figure 6B:
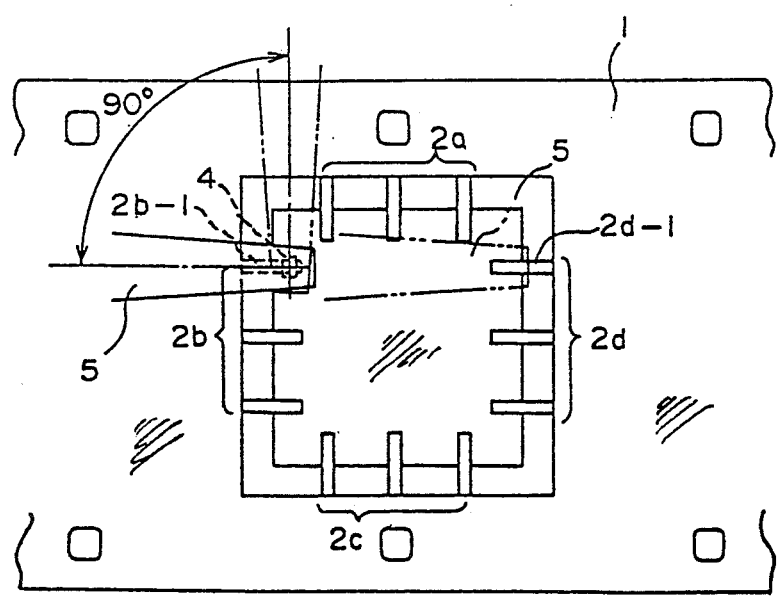

One embodiment of the method of the present invention for bonding a semiconductor device to a tab tape will be described with reference to FIGS. 1 and 2. Elements which are the same as in FIG. 6, or which correspond to the elements in FIG. 6, are labeled with the same reference numbers and not described in detail.

Figure 1:
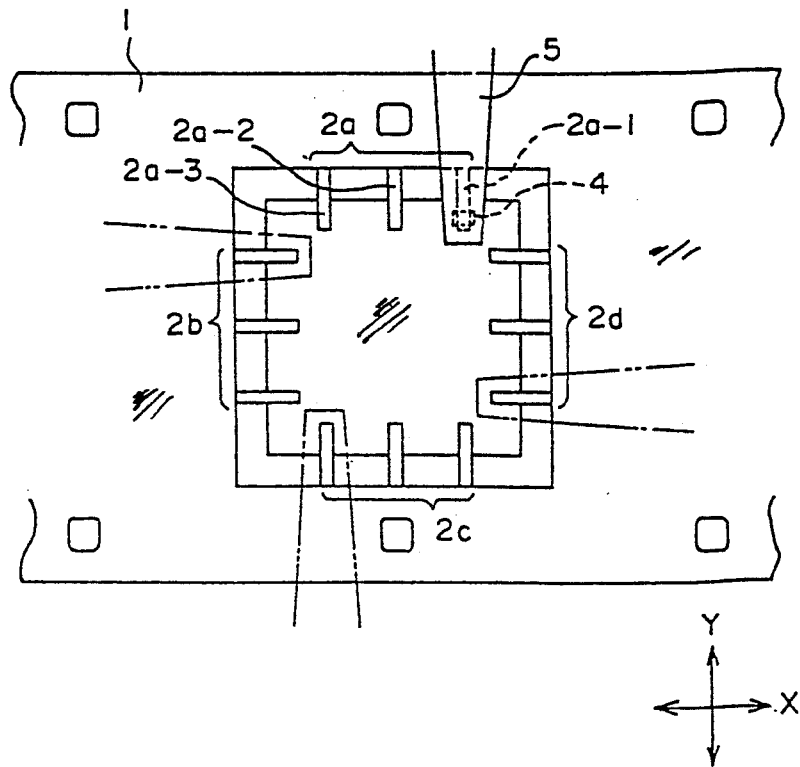
FIGS. 1 and 2 are top plan views which illustrate one embodiment of the method of the present invention for bonding a semiconductor device to a tab tape.
Figure 2:
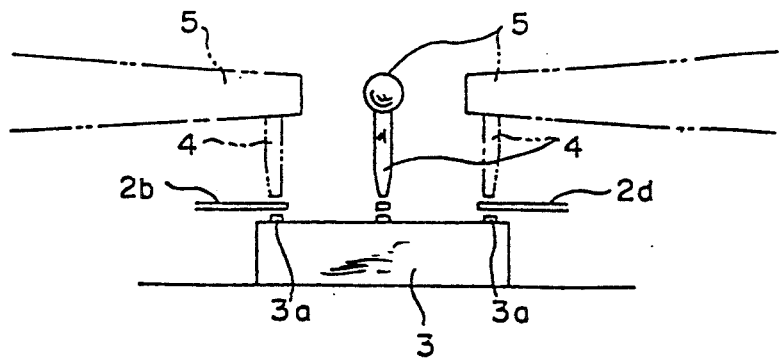

As shown in FIG. 1, a horn 5 is installed so that its axial direction is perpendicular to the direction A which is the direction of the movement of the tab tape 1 (i.e., the X direction in this embodiment). In other words, the horn 5 is oriented in the Y direction. As in conventional devices, the horn 5 is provided so that it can rotate on a vertically moving block that has a horn rotating mechanism (not shown). The vertically moving block is free to move up and down on a bonding head which is mounted on an X-Y table.

An explanation of bonding method will be made for a case in which the bonding starts with the inner lead 2a-1 of the inner lead row 2a.

First, the bonding tool 4 is lowered so as to press the inner lead 2a-1 against a corresponding electrode, and an ultrasonic vibration is applied to the horn 5. Bonding is thus performed to the inner lead 2a-1 so that it is connected to the electrode. Afterward, the bonding tool 4 is raised and moved in the X direction. The bonding tool 4 is positioned above the inner lead 2a-2, and the inner lead 2a-2 is bonded to a corresponding electrode by the same operation as that described above.

When the inner leads of inner lead row 2a are all bonded, the bonding head is driven in the Y direction (not rotated at all here), and the bonding tool 4 is positioned above the inner lead 2c-1 of the inner lead row 2c. The inner leads of the row 2c are bonded in the same manner as the inner leads of the row 2a are bonded.

When the bonding to the inner leads of the row 2c has been completed, the horn 5 is rotated 90 degrees so that the axial direction of the horn 5 is oriented in the X direction, i.e., the same direction as the movement direction A of the tab tape 1. This is shown in FIG. 2.

The bonding head is then driven in the Y direction so that the bonding tool 4 is positioned above the inner lead 2b-1 of the inner lead row 2b. The inner leads of the row 2b are bonded by the same bonding operation as that described above.

When the bonding to the inner leads of the row 2b has been completed, the bonding head is driven in the X direction or driven straight so that the bonding tool 4 is positioned above the upper-end inner lead 2d-1 of the inner lead row 2d. The inner leads of the row 2d are all bonded by the operation same as described above. When the bonding to the inner leads of the row 2d has been completed, the horn 5 is rotated back 90 degrees, and the bonding head is driven in the Y direction. The bonding tool 4 is thus returned to the starting position.

The direction in which the ultrasonic vibration is applied to the bonding tool 4 in the process of bonding of the inner leads of rows 2a through 2d to the corresponding electrodes is the same as the axial direction of the horn 5. Since the bonding tool 4 is caused to undergo a reciprocating motion by the ultrasonic vibration in this direction, the bonding effect can be uniform for the inner leads of the rows 2a and 2c and the inner lead of the rows 2b and 2d.

As seen from the above, the inner lead of rows 2a and 2c on the two opposite sides are respectively bonded, and then the horn 5 is rotated 90 degrees to bond the inner leads of rows 2b and 2d which are the remaining two opposite sides. Thus, the number of movements in which the horn 5 is shifted positionally is reduced, thus improving the productivity.

The conventional apparatus described in Japanese Patent Application Publication No. 62-27741 may be used to perform the method of bonding semiconductor devices to a tab tape that is described above.

On embodiment of an ultrasonic bonding apparatus which is suitable for the method for bonding semiconductor elements to a tab tape described above is shown in FIGS. 3 through 5.

Figure 3:
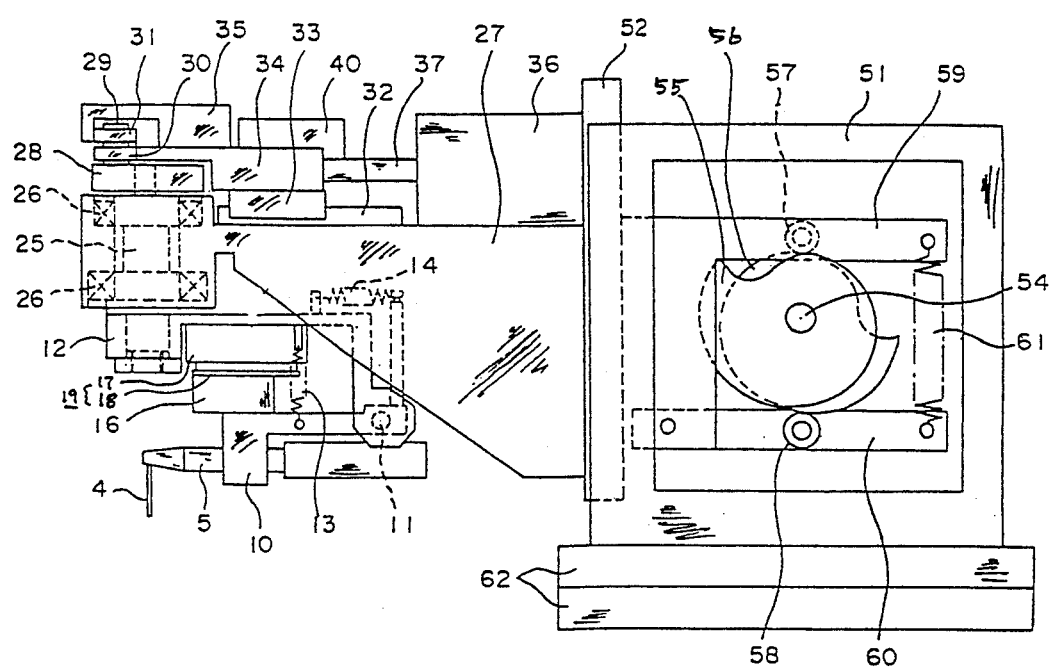
Figure 4:
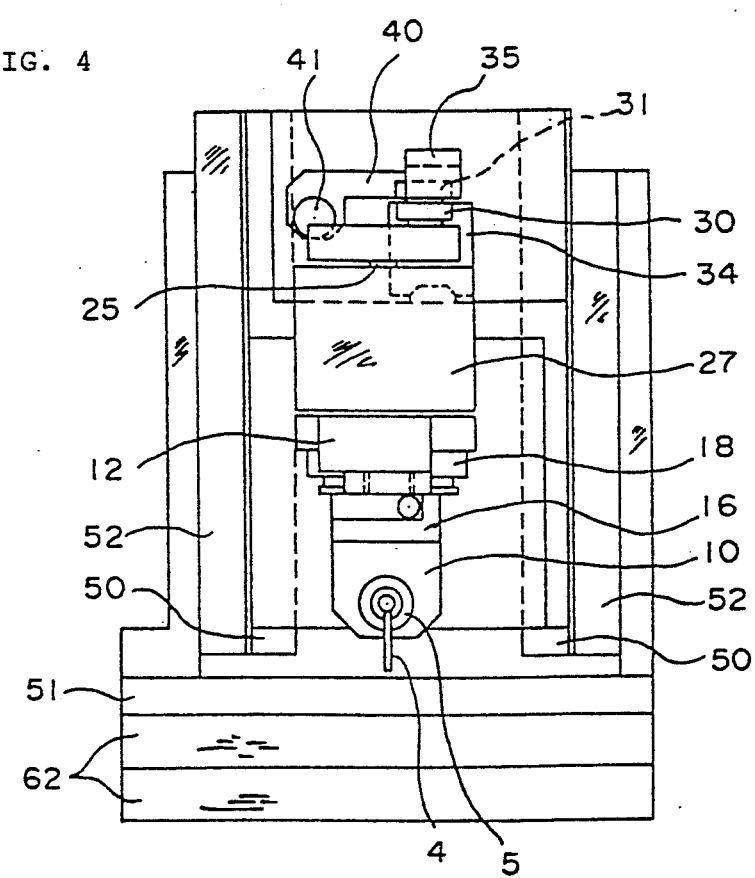

As seen in FIG. 3, a horn 5 which has a bonding tool 4 mounted at the end is held in a holder 10. Shaft 11 is mounted to this holder 10, and this shaft 11 is supported so that it is free to rotate by being supported by both side walls of a reversed U-shape rotary block 12.

Reference numeral 13 is a balancing spring. This spring 13 urges the bonding tool 4 upward so that the weight of the horn 5 and holder 10 is alleviated. Reference numeral 14 is a bonding load spring which urges the bonding tool 4 downwardly. These springs are installed between the holder 10 and rotary block 12.

An attachment plate 16 is provided on the upper surface of the holder 10. Core 17 of a linear motor 19 which is used to set the bonding load (the linear motor being a solenoid consisting of a core 17 and coil 18, etc.) is mounted on the attachment plate 16, and the coil 18 of the motor is mounted on the undersurface of the rotary block 12.

The rotary block 12 is attached to the lower end of a rotary shaft 25 which is positioned above and coaxial with the bonding tool 4. The rotary shaft 25 is rotatably supported by a vertically moving block 27 via bearings 26.

A rotary driving plate 28 is attached to the upper end of the rotary shaft 25, and a shaft 29 is attached to the upper surface of the rotary driving plate 28. The shaft 29 is eccentric relative to the axis of the rotary shaft 25, and two rollers 30 and 31 are rotatably mounted on the shaft 29.

A guide rail 32 is provided on the upper surface of the vertically moving block 27, and a slider 33 is installed on the guide rail 32 so as to be horizontally slidable. A first actuating plate 34 is provided on the slider 33, and a second actuating plate 35 is provided on the surface of the first actuating plate 34. The rollers 30 and 31 are arranged so that the two rollers are sandwiched from both sides by the first actuating plate 34 and the second actuating plate 35. In particular, the lower roller 30 is in contact with the first actuating plate 34 and the upper roller 31 is in contact with the second actuating plate 35.

Moreover, a cylinder assembly 36, which is an air cylinder, hydraulic cylinder, solenoid, etc., is provided on the upper surface of the vertically moving block 27, and the actuating rod 37 of the cylinder assembly 36 is connected to the first actuating plate 34.

Figure 5:
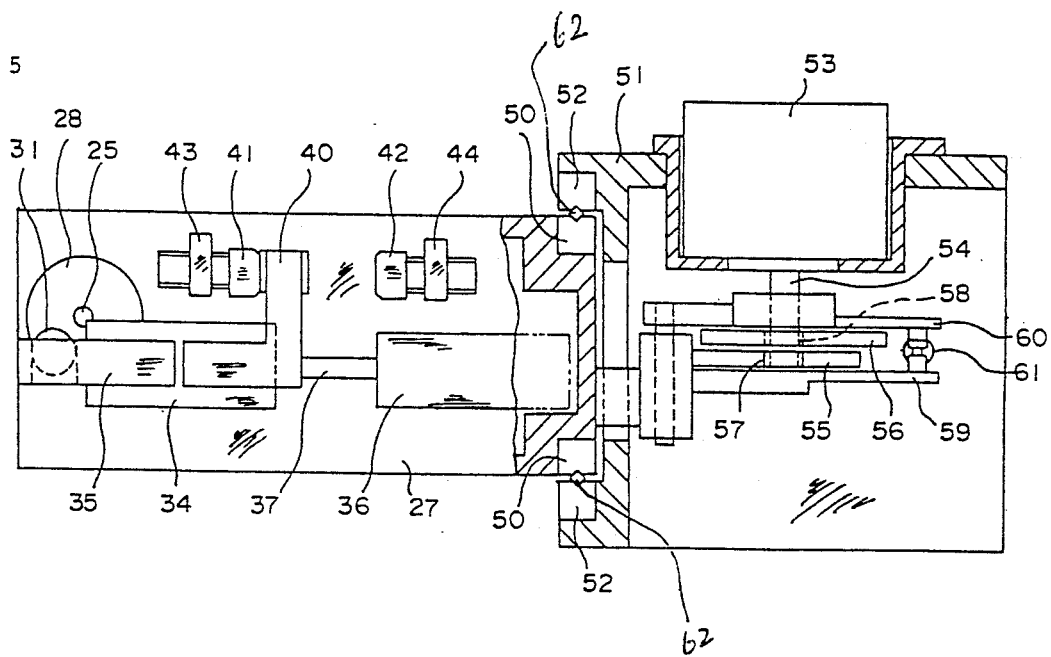

As seen in FIG. 5, an L-shaped rotation-regulating plate 40 is secured to the first actuating plate 34, and stoppers 41 and 42 are installed so that they are positioned on both sides of the rotation-regulating plate 40 to face each other with a space in between. The stoppers 41 and 42 are screwed respectively to supporting blocks 43 and 44 which are fixed to the upper surface of the vertically moving block 27. The stoppers 41 and 42 can be positionally adjusted when turned, so that the space between the two stoppers are changed.

With the structure as described above, when the cylinder assembly 36 is actuated and the actuating rod 37 is drawn inwardly from the position where the rotation-regulating plate 40 is in contact with the stopper 41 (see FIG. 5), the first actuating plate 34 is moved to the right (in the drawings) until the rotation-regulating plate 40 comes into contact with the stopper 42. When the first actuating plate 34 is moved to the right, the rollers 31 and 30 are caused to also be moved to the right by the second actuating plate 35 which is provided on the first actuating plate 34 and in contact with the lower roller 30. Accordingly, the rotary shaft 25 is rotated because of an eccentric relation ship between the shaft 29, that has the rollers 30 and 31, and the rotary shaft 25. As a result, the rotary block 12 is rotated about the rotary shaft 25, and the horn 5, which is attached to the rotary block 12 via the holder 10, is rotated about the rotary shaft 25 (i.e., about the bonding tool 4) which is installed coaxially with the rotary shaft 25.

When the cylinder assembly 36 is actuated and the rod 37 is pushed out, the rotary shaft 25 is rotated back 90 degrees.

As seen from the above, the angle of rotation of the horn 5 is determined by the distance between the stoppers 41 and 42. Accordingly, to make a 90 degree rotation of the horn 5 (as in the method for bonding semiconductor elements to a tab tape that has inner leads in such a manner as described above), the range of the movement of the first actuating plate 34 is adjusted beforehand by changing the distance between the stoppers 41 and 42 so that the rotating shaft 25 is rotated 90 degrees.

In FIG. 5, V-rails 50 which are movable are provided on both sides of the right end of the vertically moving block 27. The V-rails 50 are sandwiched by another set of V-rails 52, which are provided on the bonding head 51 with rollers (or balls) 62 between the rails 50 and 52 so that the rails 50 are vertically slidable.

A motor 53 is installed in the bonding head 51, and two cams 55 and 56 are attached to the output shaft 54 of the motor 53. The two cams 55 and 56 are the same in diameter (and shape as shown in FIG. 3). Cam followers 57 and 58 are respectively mounted on arms 59 and 60. The cam follower 57 follows the shape of upper surface of the cam 55, and the cam follower 58 follows the shape of under surface of the cam 56.

One end of the arm 59 is connected to the vertically moving block 27, and one end of the arm 60 is pivotally connected to the arm 59. Between the other ends of the arms 59 and 60 is a spring 61, and by this spring 61, the cam followers 57 and 58 are pressed against the cams 55 and 56.

The bonding head 51 is mounted on an X-Y table 62 which is driven in the X-Y directions by a driving means that is not shown in the drawing.

When the motor 53 rotates, the arms 59 and 60 move along the profiles of the cams 55 and 56, so that the vertically moving block 27 moves up and down along the V rails 52. Thus, the rotary block 12 and bonding tool 4 are raised and lowered.

A brief explanation will be given for a case wherein the apparatus described above is utilized in the method of bonding semiconductor elements to a tab tape illustrated in FIGS. 1 and 2.

First, with the X-Y table 62 having been actuated so that the bonding tool 4 is brought above the inner lead 2a-1 as shown in FIG. 1, the motor 53 is rotated. The bonding tool 4 is thus lowered so that it comes into contact with the inner lead 2a-1. Prior to this contact, the linear motor 19 for setting the bonding load is actuated to apply a necessary load to the bonding tool 4. The inner lead 2a-1 is pressed against a corresponding electrode, and an ultrasonic vibration is applied to the horn 5, thus a bonding of the inner lead 2a-1 to the electrode is performed. Afterward, the motor 53 is rotated to raise the bonding tool 4. By repeating this operation, all the inner leads of the rows 2a and 2c are bonded as described above with reference to FIG. 1.

After these bonding operations, the cylinder assembly 36 is actuated so that the horn 5 is shifted 90 degrees. Then, by performing the same bonding operation as in the case of the inner lead 2a-1, all the inner leads of the inner lead rows 2b and 2d are bonded as illustrated in FIG. 2.

As seen from the above, since the horn 5 is rotated by actuating the cylinder assembly 36, which is lesser in weight than a motor, the overall weight of the entire apparatus can be greatly reduced. Furthermore, a rotational control of the horn can easily be accomplished merely by switching the cylinder assembly 36 ON and OFF. In addition, since the angle of the rotation of the horn 5 is determined by the positions of the stoppers 41 and 42 or distance between the two, a high-precision rotation is obtained.

Furthermore, the ultrasonic bonding apparatus of the present invention can be used not only for the bonding of semiconductor devices to a tab tape, but also for wire bonding. In this case, the rotary shaft 25 is hollow, and a tool through which a wire is passed is used as the bonding tool 4 as in conventional devices. It goes without saying that a clamper is used in a process of cutting the wire in this case.

According to the present invention for bonding semiconductor devices to a tab tape, as is clear from the above description, the leads on two opposite rows or sides are first respectively bonded, the horn is rotated 90 degrees, and then the leads on the other two rows or sides are bonded. Thereafter, the horn is rotated back 90 degrees for the bonding to a next product. Accordingly, the number of rotations of the horn is half (two times) the prior art (four times), and productivity is improved.

Furthermore, in the ultrasonic bonding apparatus of the present invention, a cylinder assembly such as an air cylinder which is light is used to rotate the horn that has a bonding tool. Accordingly, the apparatus is light as a whole.

In addition, the control of the rotation of the horn can easily be accomplished merely by switching the cylinder assembly ON and OFF. Furthermore, since the angle of rotation of the horn is determined by a pair of stoppers, a high-precision rotation of the bonding tool is obtained.

We claim:

1. An ultrasonic bonding apparatus characterized in that said apparatus comprises:
   a horn which holds a bonding tool;
   a rotary shaft which indirectly holds said horn and is installed coaxially with said bonding tool;
   a vertically moving block which supports said rotary shaft such that said shaft is rotatable;
   a vertically driving mechanism which moves said vertically moving block up and down, and
   a rotary driving mechanism which rotates said rotary shaft, said rotary driving mechanism comprising rollers which are mounted on said rotary shaft and are eccentric relative to said rotary shaft, a cylinder assembly which moves linearly and causes said rollers to move, and stoppers which restrict the range of movement of said rollers.

2. An ultrasonic bonding apparatus for bonding inner leads installed on a tab tape to electrodes of a semiconductor device, comprising:
   a vertically moving block which is movable up and down and rotatably supports a rotary shaft;
   a horn provided with a bonding tool at one end, said horn being installed at the bottom of said rotary shaft;
   a rotary driving mechanism provided on said vertically moving block to rotate said rotary shaft, said rotary driving mechanism comprising rollers which are eccentrically mounted on said rotary shaft, a cylinder assembly having a cylinder rod which moves linearly and is connected to an actuating member that sandwiches said rollers and causes said rollers to move parallel to said cylinder rod and to rotate said rotary shaft, and a pair of stoppers which are provided with a space in between so that said actuating member is moved between said space so as to define the range of movement of said rollers.

3. An ultrasonic bonding apparatus according to claim 2, wherein a distance between said stoppers is changed by moving said stoppers toward and away from each other.

* * * * *